United States Patent [19]

Frangolacci

[11] Patent Number: 4,748,790
[45] Date of Patent: Jun. 7, 1988

[54] SHELTER WITH ARMORING COMPOSITE WALLS AND DOORS

[75] Inventor: Roger Frangolacci, Le Cannet, France

[73] Assignee: Lhotellier Bachmann Industrie (L.B.I.) S.A., Perrecy-les-Forges, France

[21] Appl. No.: 944,868

[22] Filed: Dec. 22, 1986

[30] Foreign Application Priority Data

Dec. 27, 1985 [FR] France ................................ 85 19328

[51] Int. Cl.⁴ ............................................. E04H 9/10
[52] U.S. Cl. ...................................... 52/809; 52/79.1;
52/309.1; 109/49.5; 174/35 MS
[58] Field of Search ...................... 52/79.1, 79.8, 809,
52/309.1; 109/49.5; 174/35 MS

[56] References Cited

U.S. PATENT DOCUMENTS

| | | | |
|---|---|---|---|
| 3,129,278 | 4/1964 | Watt et al. | 174/35 MS |
| 3,147,336 | 9/1964 | Mathews | 174/35 MS |
| 3,229,429 | 1/1966 | Conrad | 174/35 MS |
| 3,236,935 | 2/1966 | Patton | 174/35 MS |
| 3,531,577 | 9/1970 | Garlington | 174/35 MS |
| 3,557,777 | 1/1971 | Cohen | 174/35 MS |
| 3,790,696 | 2/1974 | Lindgren | 174/35 MS |
| 4,370,831 | 2/1983 | Hamilton | 174/35 MS |
| 4,655,012 | 4/1987 | Downey | 174/35 MS |
| 4,691,483 | 9/1987 | Anderson | 52/79.1 |

FOREIGN PATENT DOCUMENTS

| | | | |
|---|---|---|---|
| 54098 | 6/1982 | European Pat. Off. | 35 MS/ |
| 2543602 | 12/1985 | France . | |

Primary Examiner—J. Karl Bell
Attorney, Agent, or Firm—Laubscher & Laubscher

[57] ABSTRACT

A shelter contains walls enframed by members of a metal structure. So that the shelter offers efficient protection against violent explosions, and especially against the blast produced by a nuclear explosion, a wall consists of an internal panel having at least one metal side connected electrically to structure members enframing the wall, an external armoring panel, an air space between the internal and external panels, and energy absorbing means, such as flexible synthetic seals, located in the air space for keeping the external panel floating between the internal panel and flanges of the enframing members. This wall can form a door to the shelter.

40 Claims, 7 Drawing Sheets

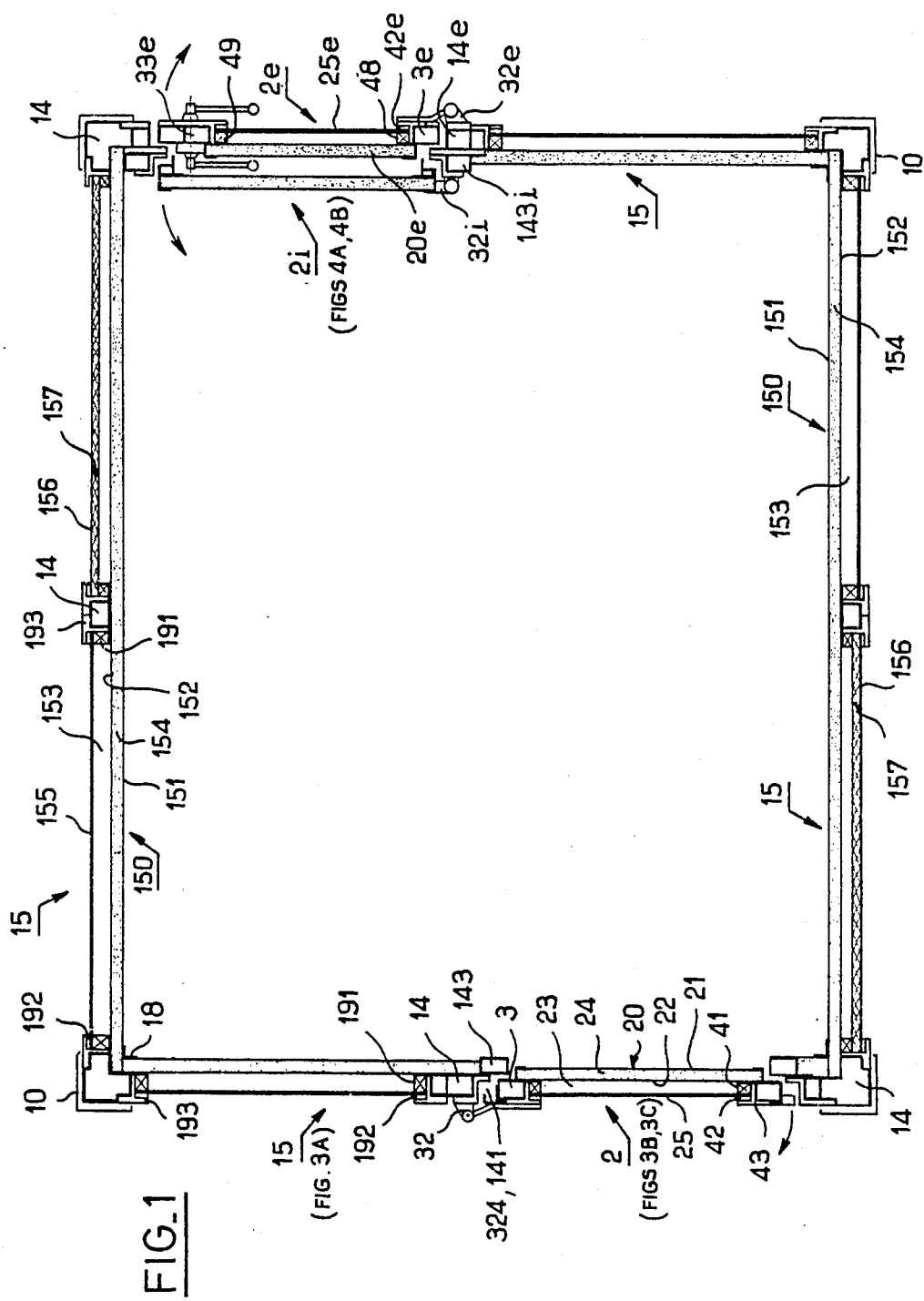

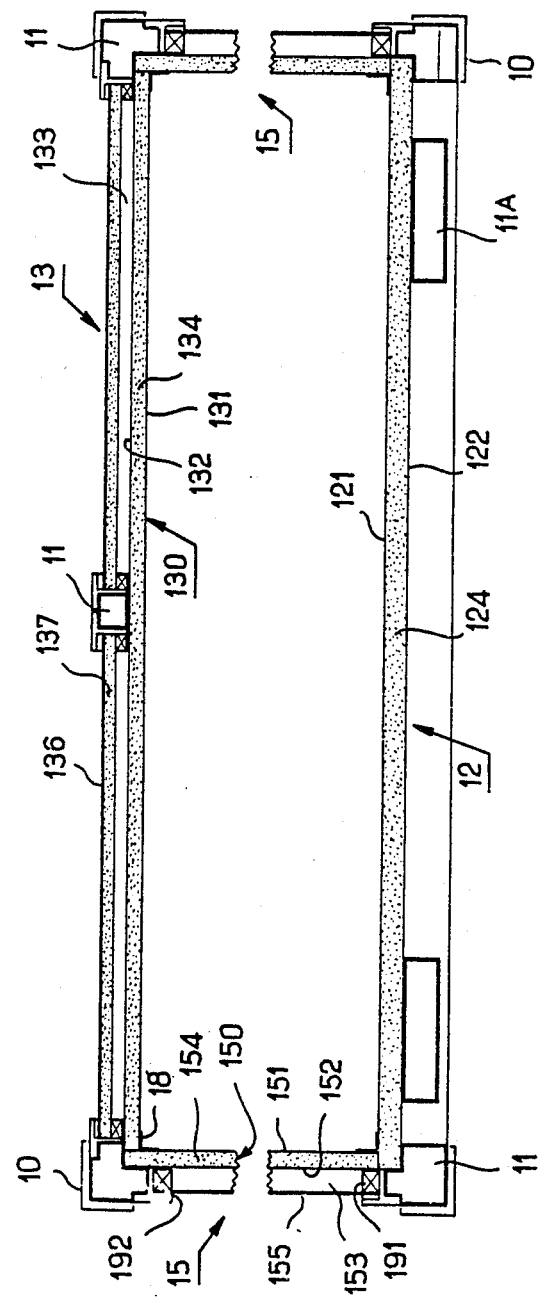
FIG._2

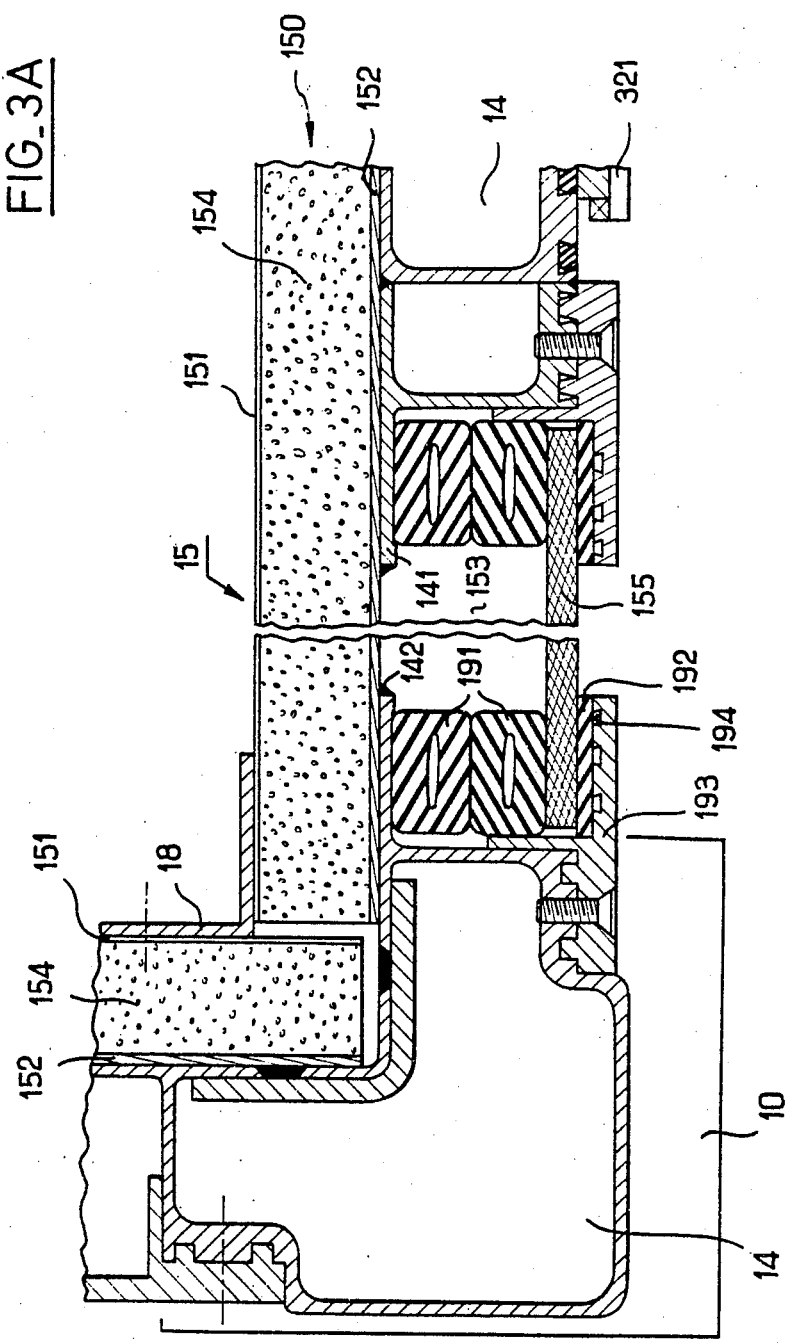

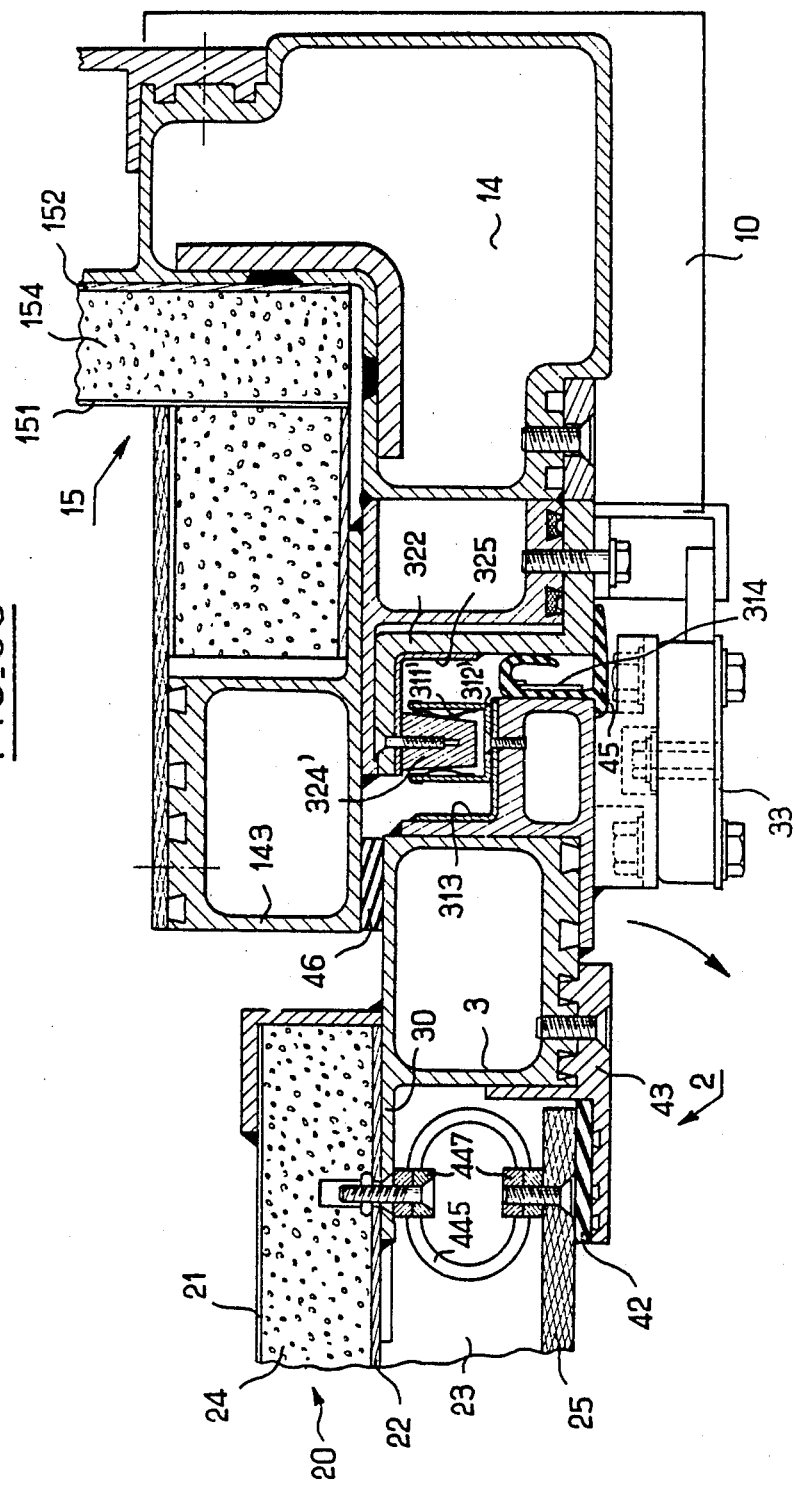
FIG_3C

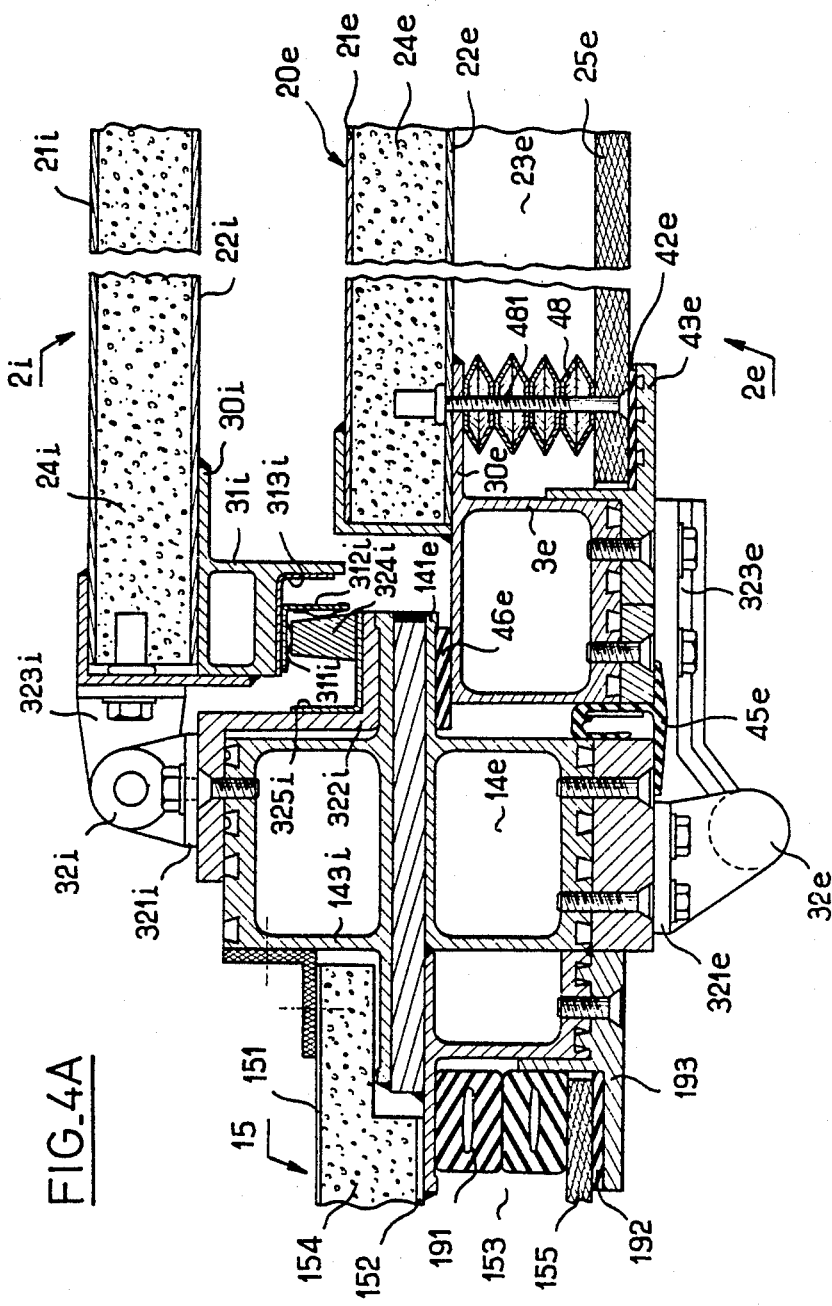
FIG_4A

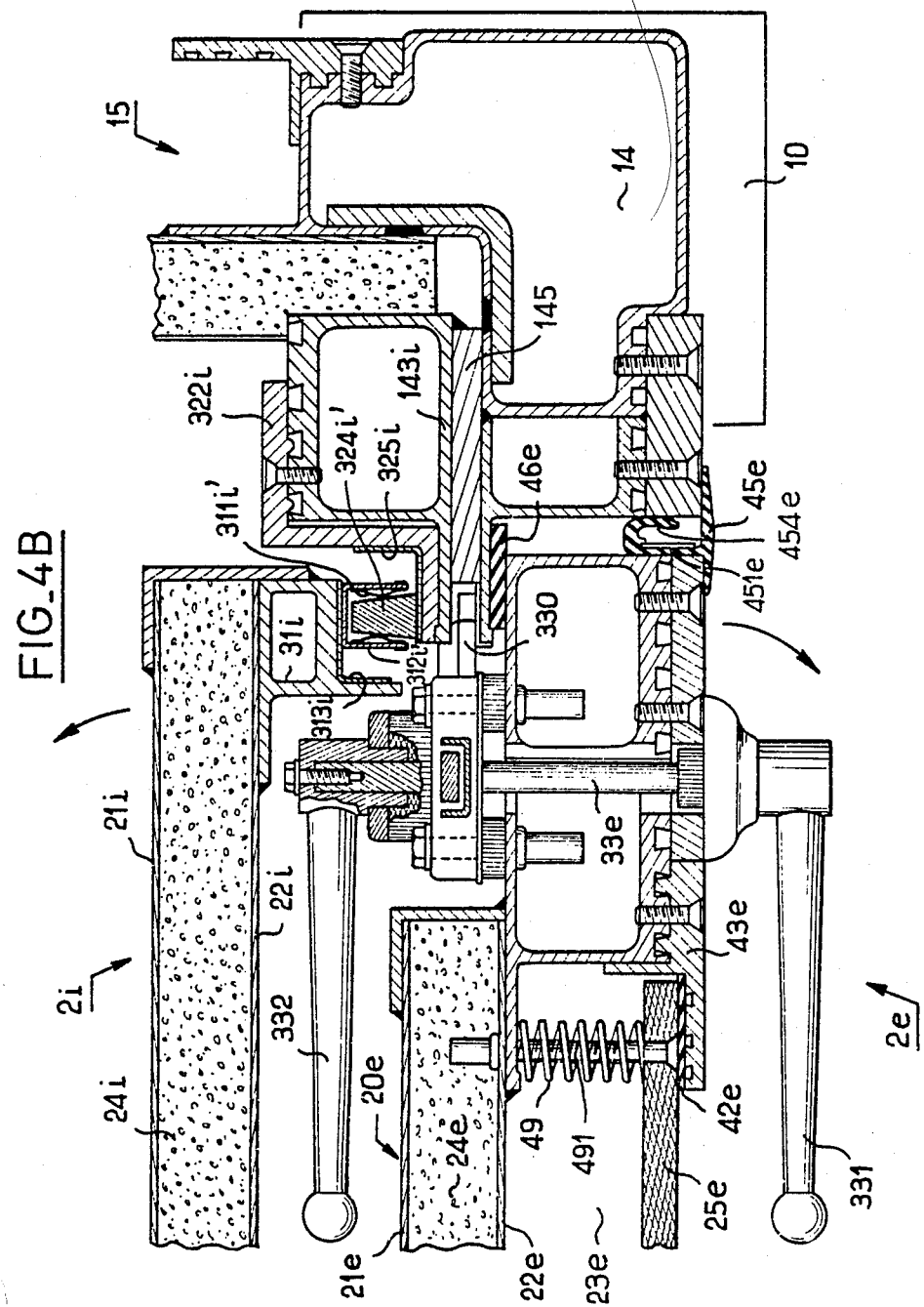

SHELTER WITH ARMORING COMPOSITE WALLS AND DOORS

BACKGROUND OF THE INVENTION

1. Field of the invention

The present invention relates to a technical shelter having walls enframed by members of a metal structure. This shelter can be portable, especially aeroportable, and is designed to provide efficient protection of equipments and users not only against any bad weather condition but also against electromagnetic and radioelectric interference.

2. Description of the Prior Art

Such a shelter is described in French Pat. No. 2,543,602 (FRANGOLACCI). The walls of this shelter each consists of a single sandwich panel having a core formed of light wood, such as balsa, or in polyurethane foam, and surface layers, such as aluminum sheets cemented to the sides of the core.

The walls are fastened rigidly to the structure of the shelter, thus forming a double Faraday cage. The metal layers of the walls are coupled to cross-bars, posts and girders of the structure by seam welding so as to obtain correct electrical continuity, thereby shielding or armoring against all radiations of electromagnetic and radioelectric waves within a range from one hertz to about ten gigahertz.

Nevertheless this shelter does not provide efficient protection against one of the main effects resulting from a violent explosion, particularly nuclear, expressed by a powerful shock wave.

OBJECT OF THE INVENTION

The main object of this invention is to provide a technical shelter offering efficient protection against the mechanical effect due to the deflagration of a nuclear explosion by absorbing to a great extent, the blast, the shock wave and the acoustic waves emanating from this explosion.

SUMMARY OF THE INVENTION

Accordingly, a primary object of the invention is to provide a shelter having a wall including an internal panel having at least one metal side connected electrically to members of the structure enframing the wall, an external armoring panel, an air space between the internal and external panels, and first and second energy absorbing means for keeping the external panel floating between the internal panel and the structure members enframing the wall. The composite structure of such a wall can be also that of a door of the shelter. The metal side of the wall can be connected to the structure by seam welding.

The first energy absorbing means, which is located in the air space between the internal and external panels of the wall, cushions any movement of the external panel due to the blast of an explosion, thus preventing violent vibrations of the shelter. The air space acts as an "acoustic trap" and contributes to attenuating the acoustic waves generated by the explosion. The second energy absorbing means, preferably located between edges of the outer side of the external wall and edges or coverplates of the frame of the structure enframing the wall, principally provides the sealing even when the external panel moves towards the inside, by compressing the first energy absorbing means.

The first energy absorbing means can be in the form of rubber or elastomeric strips, preferably tubular strips, rings or helical springs or cables secured to the internal and external panels, or still again coil springs or sets of Belleville washers disposed with axes perpendicular to the panels. The second energy absorbing means preferably consists of a flat rubber or elastomeric strip framing.

According to other aspects of this invention, the external panel is a panel armored i.e., shielded against projectiles of all kinds, whereas the internal panel chiefly provides protection against electromagnetic and radioelectric waves. Preferably the external panel of a wall is in synthetic material, preferably reinforced with fibreglass, carbon or similar material, or in metal, preferably expanded, or consists of a first sheet of synthetic material, preferably of laminate, fibre-layer type, type KEVLAR, surrounded by a protective envelope preferably in PVC, and a second sheet, preferably honeycomb type, in aluminium or phenolic paper, or a second sheet of sandwich panel type. The first and second sheets are preferably directed respectively towards the outside and inside of the shelter.

BRIEF DESCRIPTION OF THE DRAWING

Further objects, features and advantages of the invention will be apparent from the following detailed description of several preferred embodiments of the invention with reference to the corresponding accompanying drawings in which:

FIG.1 is a schematical horizontal cross-sectional view of a shelter embodying the invention, containing a single door and a double door in two parallel sides;

FIG.2 is a schematical vertical cross-sectional view of the shelter;

FIGS. 3A, 3B and 3C provide a detailed horizontal cross-sectional view of the side of the shelter containing the single door; and FIGS. 4A and 4B show a detailed horizontal cross-sectional view of the recess of a double door in the shelter.

DESCRIPTION OF THE PREFERRED EMBODIMENTS

Figure 3B:
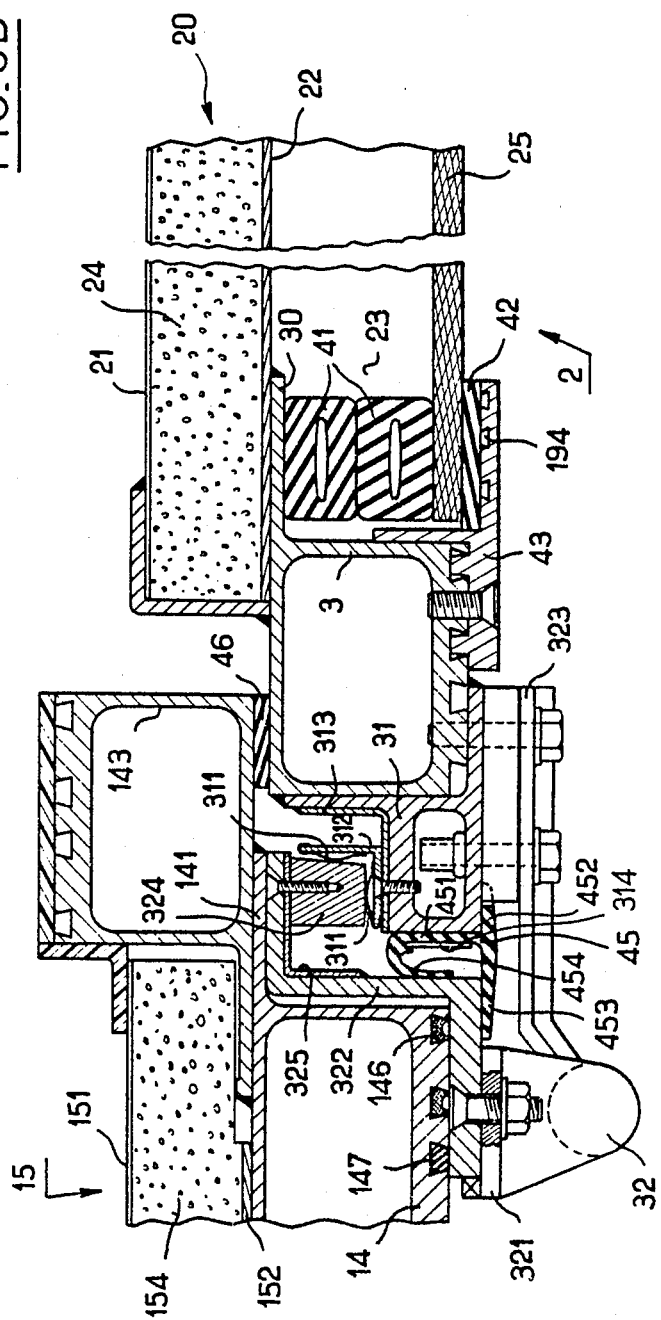

As shown in FIGS. 1 and 2, a technical shelter has a rigid, monobloc, parallelepipedic structure in light alloy substantially consisting of aluminium. The structure consists of tubular sections linked together by eight ISO keys 10. Certain sections are girders and cross-bars 11 designed to enframe a floor 12 and a ceiling 13 so as to form a substructure and roof, respectively, for the shelter, and other sections are posts 14 enframing, with the respective cross-bar and girders, vertical sides 15 of the shelter. Depending on the dimensions of the shelter, for example sides can be split up into several walls juxtaposed by intermediate posts 14, particularly when an access door is provided, and the ceiling can contain intermediate cross-bar and/or girders 11.

Accessorily the shelter is equipped in the substructure with two rectangular cross-section profiled cross-bars 11A designed to let through a fork-lift truck, with two inverted-omega section profiled girders (not shown) acting as pads to load the shelter onto a surface such as that of an aircraft cargo compartment, and with bushings, captive nuts or similar on the circumference of the girders and cross-bars enframing the floor, in particular designed to anchor the shelter in a carrier vehicle such as an aircraft. In posts 14, between the keys, cavities in the form of a handle can be provided consisting of anchoring yokes to couple a sling and thus hoist the shelter through a hoisting gear.

According to a preferred embodiment which will be referred to below where the numerical particulars are concerned, the shelter has an overall length of 2.99 m, a width of 2.44 m and a height of 2.33 m.

The floor 12 consists of a rectangular sandwich type panel formed of a polyurethane foam core 124 having a thick of 57 mm and a density of 150 kg/m$^3$, and by two aluminuim layers 121 and 122 having a thick of 2.5 mm and cemented to the sides of the core. When the floor 12 cannot be taken down, it is seam welded to the four ISO keys and to the girders and cross-bars in the substructure, which provides perfect sealing in view of electrical continuity. In the case of a screwed collapsible floor, metal braids and rubber strips enframed by the braids are inserted into grooves around the whole periphery of the substructure between firstly the floor and secondly the keys, the cross-bars and girders, so as to provide perfect electrical continuity and shielding, together with tight sealing between structure and floor.

Thus the shelter structure and the floor have, generally speaking, structures similar to those described in French Pat. No. 2,543,602, and this patent should be referred to for further details.

The features of the shelter, specific to the invention, is now described, firstly in so far as concerns the composite structure of the shelter walls, sides 15 and ceiling 13, then so far as concerns a single door then a double door.

According to a specific object of the invention, each wall consists of an internal panel, and an external armoring panel, and an air space held captive between these two parallel panels.

An internal panel is a sandwich type panel 130, 150, comprising two aluminium layers and a layer of polyurethane foam. Each inside skin 131, 151 has a thickness of 1 mm. Each outside skin 132, 152 has a thickness of 2.5 mm, and defines the air spaces 133, 153, respectively. Foam layers 134, 154 are inserts glued between the two layers and each has a thickness of 36 mm and a density of 100 kg/m$^3$. As shown in detail in FIG. 3A, the outer skin 132, 152 of an internal panel is generally applied against a side of the internal corner of each of the posts, girders or cross-bars, respectively, enframing the internal panel, and/or against such a side followed by a support rib 141, and is fastened to these structural members by seam weld beads such as bead 142. These beads thus provide perfect sealing between the inside and the outside of the shelter on the level of the air spaces. Moreover the inner layers 131, 151 of the internal panels of the walls and ceiling and the inner layer of the floor are mechanically and electrically connected by welded internal cladding sections 18 in aluminium, so that internal panels 130, 150 and the floor 12 form a double Faraday cage.

An external shielding panel of a wall 13, 15 or of an outer door leaf 3, 3e described below is, according to a first embodiment shown at the top left and bottom right in FIG. 1, laterally in FIG. 2 and in detail in FIG. 3, laminated sheet or plate 155 in synthetic material, such as epoxy resin, refinforced with fibreglass, fibrecarbon or similar materials, or metal components, such as sheets of expanded metal. Sheet 155 has a thickness of 10 to 14 mm. According to a second embodiment shown at the top right and bottom left in FIG. 1, an external panel of a wall 13 is composed of an outer sheet 156 consisting of 23 layers or folds of synthetic fibres to form a KEVLAR laminate, around which a protective PVC fabric envelope is sealed with NBC (neutron-biological-chemical) characteristics, and an inner honeycomb sheet 157 in aluminium or phenolic paper, NOMEX type, covered with two layers of aluminium or epoxy glass. Sheets 156 and 157 are cemented. Sheets 156 and 157 are repsectively 4 mm and 20 mm thick. According to a third embodiment preferably used for the ceiling 13, as shown in FIG. 2, an external panel is composed of an inner sandwich type sheet 137, similar to the internal panel 130, 150, comprising a layer of polyurethane foam cemented between a 1 mm thick inner layer and a 2.5 mm thick outer layer of aluminium, and an outer sheet 136 identical to said sheet 156.

The outer panels confer excellent resistance in ballistics, i.e., against all projectiles striking against the shelter violently.

The resistance of the shelter to air blasts caused by explosions is mainly obtained by flexible couplings, i.e., energy absorbing means, between the internal and external panels in each wall, jointly with the air space 133, 153 which also attenuates any acoustic wave due to an explosion, by mechanically uncoupling the internal and external panels.

According to the embodiment shown in detail in FIG. 3A, the flexible coupling is obtained by first rubber or elastomeric seals, or coupled pairs of rubber seals 191, and a second rubber or elastomeric seals 192 forming double flexible frames enframed by the corresponding posts, cross-bars of girders 14, 11. The seals 191 are held captive between ribs 112, 141, to which the outer skins 132, 152 of the internal panels 130, 150 are welded, or are held captive between these latter layers and the inner sides of the external panels 137+138, 155, 156+157. Each of the seals 192 is flat and clamped in between the outer sides of an external panel and a first flange of a T-section aluminium cover-plate, known as Tee grip 193, of the type described in French Pat. No. 2,543,602. A second flange of the Tee is fastened by means of screws to a grooved notch in the corresponding post, girder or cross-bar, facing the outside. Against a side of the post, girder or cross-bar, a Tee strut is applied against which the edge of at least one of the seals 191 and flat seal 192 abuts. In the first flange of the Tee are made grooves in which elastomeric seals 194, such as neoprene seals, can be inserted. The seals 194 are applied against flat seal 192 so as to improve the tight sealing.

As shown in FIG. 3A, seals 191 are rectangular cross-section tubular rubber strips, and can therefore be relatively crushed so as to cushion and absorb, jointly with the adjacent air space 153, any sudden thrust from the external panel 155 to the inside of the shelter. In this case, seals 191 are compressed and seals 192 are expanded, whilst providing sufficient tight sealing through the presence of the small neoprene seals 194 and the contact between the Tee struts 193 and the side edges of seals 191 and 192. Thus the external panels are "floating" assembled and fastened tightly and interchangeably.

Referring to FIGS. 3B and 3C, a single door in the shelter, here pushed to the right towards the outside, contains a leaf 2 having a composite structure similar to that of a wall 13, 15, i.e., having an internal panel 20, an air space 23, and an external panel 25. According to the illustrated embodiment of the door recess, the internal panel 20 is a sandwich panel with polyurethane foam core 24, having a thick of 36 mm, and a density of 100 kg/m³ and with aluminium inner and outer shell layers 21 and 22 having a thick of 2.5 mm. The external panel 25 is, according to the embodiment illustrated, a laminated panel in reinforced synthetic material, 14 mm thick. The air space 23 is 50 mm thick. Panels 20 and 25 are assembled in a two-post and two-cross-bar monobloc pre-frame 3, of rectangular cross-section, and support ribs 30, similar to the assembly of panels 130 and 135, 150 and 155 between the posts, girders or cross-bar in the structure.

Various embodiments of first energy absorbing means against explosion blast are described hereinafter. These various embodiments are insertable both in a door and in a shelter wall.

According to a shelter first embodiment shown in FIG. 3B, a first energy absorbing means consists of two tubular strips 41 coupled between ribs 30 and the external panel 25, like the assembly of strips 191. According to a second embodiment, shown in FIG. 3C, an energy absorbing means against blast is in the form of oval steel rings 445 located in the air space 23 on its periphery and lined up vertically and horizontally along the inner circumference of the pre-frame 3 by diametrically opposite fasteners 447 secured by screws firstly to the external panel 25, and secondly to the internal ribs of pre-frame 30 and to the internal panel 20. The fasteners 447 are pairs of small jaws or half-clamps, clamping opposite portions of rings 45. According to other embodiments, the rings 445 can be replaced by helical springs or helical cables of two of which have vertical axes parallel to the posts and two others have horizontal axes parallel to the cross-bars, whose coils are held by fasteners similar to fasteners 447, or can be replaced by other flexible metal means, such as small coil springs or sets of several stacked pairs of Belleville washers, head to foot, strung around shafts or pins fastened perpendicularly to panels 20 and 25 and crossing through the air space 23.

The second energy absorbing means includes a frame in flat rubber or elastomeric strip 42 similar to strip 192, inserted between the outer side of the external panel 25 and a first flange of an external T-section cover-plate 43, similar to cover-plate 193 for wall. Cover-plate 43 and the outer side and edges of the internal panel 20 are fastened on either side of the pre-frame of leaf 3, respectively by screws and welding. Metal armoring braids and small rubber sealing strips can be provided in grooves on the junctions of cover-plates 43 and pre-frame 3, and tight neoprene seals can be provided on the junctions of cover-plate 43 and the flat seal 42.

The single door is a door having resilient conductive strips and external hinges 32 lined up along a vertical post 14 of the door frame integrated into the shelter structure. The door contains a fillister and a nonjoined straight half-joint back-fillister designed to house an electrical contact means in the form of conductive strips and cooperating stops, as will be seen later. Base metal fittings 321 of the hinges 32 are bolted against an external vertical flange of an aluminium thin profiled fram 322 in straight Z form, forming the fillister, and welded to the door. Pivoting fittings of hinges 32, such as Tee bars 323, are bolted to the pre-frame 3 and to the rectangular section core of an aluminium edge frame 31 of the leaf forming the back-fillister and having an angle-plate welded to pre-frame 3. As can be seen in FIGS. 3B and 3C, the core of the back-fillister frame 31 is placed towards the outside, substantially at mid-thickness of preframe 3, and an internal flange of the fillister section 322 is applied against flanges 111, 141 of the two cross-bars 11 and two posts 14 of the door frame, so that when the door is in the closed position, a conduit is formed around pre-frame 3 located between fillister and back-fillister, has a width substantially less than half the thickness of pre-frame 3, and is designed to house the conductive strips and stops.

Along frame 14, on the side of the hinges 32, as shown in FIG. 3B, and along the horizontal cross-bars of the fixed frame, stops consist of electrically conductive stop members 324 of trapezoidal cross section fastened by screws against the internal flange of the fillister section 322 via a thin angle-plate 325 welded to section 322. The strips are electrically conductive flexible strips 311 clipped to flanges of a small angle-plate 312 fastened by screws to the back-fillister frame via a thin angle-plate 313 welded to frame 31. With the door closed, as illustrated in FIG. 3B, angle-plate 325 is diagonally opposite angle-plate 312 and 313, and flexible strips 311 are pressed respectively against an inclined side and a small base of electrically conductive stop 324.

On the side of the vertical edge of the leaf opposite the hinges, as shown in FIG. 3C, electrical contact means similar to the above ones, and a three-locking-point safety lock 33 are provided. Nevertheless, the stop is a vertical bar 324' having an isoclese trapezium horizontal cross-sectional configuration. Two electrically conductive flexible strips 311' are clipped to parallel flanges of a thin U-section 312' which enframes stop 324'. On the closing of the door strips 311' slip along the inclined sides of angle plate 312' and are flattened against them.

Preferably the strip angle-plate 312, strip U-section 312', and stops 324 and 324' are made of an alloy with good electrical conductivity, and good resistance to corrosion, whilst offering a certain resiliency to accommodate numerous door opening and closing operations. According to a preferred embodiment said members 312, 312', 324 and 324' are in brass, and strips 311 and 311' are in a bronze and beryllium based alloy. The strips provide excellent electrical continuity between leaf 2 and the walls of the structure when the door is closed, so as to form a Faraday cage. The intermediate angle-plates 325 and 313 are bimetal, in aluminium and copper, so as to prevent a formation of galvanic couples that might damage the members in contact. Moreover welds are made on the aluminium frame 31, not directly with the brass members 312 and 312' supporting the strips, but with angle-plates 313 and 313', thus providing excellent mechanical and electrical contacts between conductive strip and back-fillister frame 31.

With the door closed, the conduit between fillister and back-fillister, containing the stop and knife contacts, is kept sealed chiefly by an outer rubber seal 45 having a T-shaped cross-section and enframing back-fillister frame 31. A leg 451 of the Tee seal 45 is held firmly against the edges of frame 31 and thin armatures 314 welded to these edges. Two external flanges 452 and 453 of seal 45 press hermetically against outer edges of the frame 31 and the external flange of the fillister Z-section 322. Flanges 452 and 453 on the side of hinges 32 through their flexibility, contribute, as door closer, to flap the door back into closed position. Leg 451 terminates in a lip portion 454 having a 180° bend permanently bent against the intermediate flat core of section 332. It is also observed that electrical joints, such as metal shielding braids 146, are provided on the outer side, together with tight seals, such as small rubber sealing strips 147, inserted between grooves and tabs of frame 11-14 of the door and the external flange of the fillister section 322.

Towards the inside, on one side of the pre-frame 3 of leaf 2, at the level of a slot between pre-frame 3 and the internal panel 20, a flat rubber framing strip 46 is cemented. The strip 46 is designed to applied against outer sides of counter-posts and counter-cross-bars 143, 113 on the fixed frame, diagonally opposite the posts and cross-bars 14, 11 of the frame, shaped similarly to the latter and extending along the internal panels of the walls around the door. The seal 46 seals off the inside of the shelter from the conduit containing stops 324, 324' and strips 311, 311' between fillisters and back-fillisters when the door is closed, and also contributes to cushioning any thrust on the leaf caused by an explosion blast.

Now referring to FIGS. 4A and 4B, a double door of the shelter includes an outer leaf door 2e, here opened pushing to the right towards the outside, and an inner leaf door 2i, here opened pushing to the left towards the inside; in this embodiment, hinges 32e and 32i of the outer and inner doors are on either side of a double door frame post. According to other embodiments, the two outer and inner doors are opened by pushing to the right or left, and the hinges of these two doors are secured respectively to two posts on either side of the door leaves. In FIGS. 4A and 4B, members in the double door operating in a similar way to members in the single doors shown in FIGS. 3B and 3C are identified by same numerical references, except for the indices e (outer) and i (inner), respectively.

The outer door provides resistances against blast and ballistics and has a structure ad assembly similar to the single leaf door 2, with the exception that it does not have any electrical stop and knife contacts, these being transferred into the inner door. Posts and cross-bars 14e of the outer door frame no longer contain a fillister section 322, and leaf 3e no longer contains a back-fillister frame 31. The fillister and back-fillister are simply squared and formed respectively by the corners of posts and cross-bars 14e at the level of their internal ribs 141e and by keys of pre-frame 3e of leaf 2e substantailly complementarily to the corners. The width of the interstice between fillister and back-fillister is blanked off, on the outer side, via a T-section rubber seal 45e having a leg 451e, and a folded lip 454e, similar to seal 45, and on the inner side, by a flat seal 46e similar to seal 46. The seals 45e and 46e are fastened to pre-frame 3e.

The composite structure of leaf 2e is similar to that of leaf 2, and consists of an inner sandwich panel 23e, an air space 20e, and an external "floating" panel 25e. Panel 20e comprises polyurethane foam core 24e and two aluminium skins 21e and 22e. First energy absorbing means is included in the air space 23e between panels 20e and 25e and is of one of the types already described. According to the embodiment in FIG. 4A, the energy absorbing means are sets of several stacked pairs of Belleville washers 48, head to foot. Washers 48 are strung around pins 481 screwed perpendicularly to panels 20e and 25e and crossing through the air space 23e. According to the embodiment illustrated in FIG. 4B, the energy absorbing means are small coil springs 49 that are guided around shafts 491 guided and screwed perpendicularly into panels 20e and 25e and cross through the air space 23e. The outer side of panel 25e is applied against a flange of a Tee cover-plate 43e via a flat seal 42e. The cover-plate 43e has with another flange fastened by screw to pre-frame 3e.

Furthermore, the outer door 2e is pivotable by means of hinges 32e having fixed fitting 321e fastened to the corresponding post 14e and having moving fitting 323e fastened to the leaf pre-frame 3e. A safety lock 33e having three locking points 330, an outer lever 331 and an inner lever 332 is included in the outer door. Lever 332 is accessible between the internal panel 20e and inner leaf 2i.

The inner door 2i is offset towards the shelter inside behind the outer door 3e. Door 2i is designed to attenuate electromagnetic and radioelectric interferences of all kinds, and to provide electrical continuity with the internal panels of the shelter walls forming a double Faraday cage. Thus inner leaf 2i has a single sandwich panel consisting of polyurethane foam core 24i and two aluminum layers 21i and 22i, and when in the closed position, is connected mechanically and electrically by contacts with conductive stops 324i and 324i' and flexible conductive strips 311i and 311i'. The fixed frame of the inner door consists of two counter-posts and two counter-cross-bars 143i welded against inner sides of posts and cross-bars 14e of the fixed frame of the outer door via spacers 145. On one of the counter-posts 143i, behind the outer hinges 32e, screws fasten fixed fittings 321i of inner hinges 32i. Moving fittings 322i of hinges 32i have base plates fixed by screws to a vertical edge of leaf 2i.

The conductive posts and strip contacts on the inner door are of the same type as those on the single door shown in FIGS. 3B and 3C and deducted from the latter by symmetry in relation to a vertical plane substantially at the level of the air spaces 153 in the walls continguous to the double door. Thus firstly, in the counter-posts and counter-cross-bars 143i is welded a Z-shaped aluminium fillister section 322i having a flange parallel to the contiguous walls and carrying trapezoidal brass stops 324i, 324i', via a thin bimetal angle-plate 325i; and secondly, on an aluminium back-fillister frame 31i having rectangular core and angle-plate welded against layer 22i, are welded vertical and horizontal bimetal angle-plates 313i that carry brass angle-plates 312i and a brass vertical U-section 312', in whose flanges are clipped flexible strips 311i and 311', cooperating with stops 324i and 324i'.

Although a parallelepipedic shelter is described above, the invention also covers extensible shelters in general polyhedral form, which can be combined into shelters intercommunicating together. Several accesses can be provided according to the assembly of the single and double doors described above. All these shelters are desiged to be transported as containers.

Moreover the structural features of the walls and doors according to the invention can also be used for any shelters, compartments, cabs whether fixed or transportable, or integrated into a land, air or sea vehicle. The term "shelter" introduced in the appended claims should therefore be understood in the broad sense of the word.

What I claim is:

1. A shelter including walls, and a metal structure having members enframing said walls, at least one of said walls comprising:
   (a) an internal panel having at least one metal side secured to and electrically connected with said structure members enframing said wall;

(b) an internal shielding panel having an outer surface the peripheral edge portions of which face the inner surfaces of outer flange portions of said wall structure members, respectively;

(c) an air space extending between said internal and external panels and said structure members, respectively; and (d) first energy absorbing means arranged in said air space for applying said peripheral edges of said external panel against the inner surfaces of said outer flange portions, thereby keeping said external panel floating between said internal panel and said structure member outer flange portions.

2. A shelter as claimed in claim 1, wherein said external panel is formed of a synthetic plastic material and is reinforced with components selected from the group consisting of fibreglass, fibrecarbon, metal, and expanded metal.

3. A shelter as claimed in claim 1, wherein said external panel consists of a first sheet of synthetic plastic material surrounded by a protective envelope, and a second sheet, said first and second sheets being directed toward the outside and inside of said shelter, respectively.

4. The shelter claimed in claim 3, wherein said first sheet is a fibre-layer laminate, KEVLAR type.

5. The shelter claimed in claim 3, wherein said protective envelope is in PVC.

6. The shelter claimed in claim 3, wherein said second sheet is honeycomb type.

7. The shelter claimed in claim 3, wherein said second sheet is in aluminium.

8. The shelter claimed in claim 3, wherein said second sheet is in phenolic paper.

9. A shelter as claimed in claim 1, wherein said wall is a portion of a shelter ceiling, and said external panel consists of a first fibre-layer laminated sheet KEVLAR type, surrounded by a protective envelope in PVC, and of a second sheet of sandwich panel type consisting of a foam core and metallized sides, said first and second sheets being directed respectively to the outside and inside of said shelter.

10. A shelter as claimed in claim 1, wherein said first energy absorbing means plurality of seals formed of flexible synthetic plastic material clamped between said internal and external panels.

11. The shelter claimed in claim 10, wherein each of said seals comprises at least one tubular strip of elastomeric material.

12. A shelter as claimed in claim 1, wherein said first energy absorbing means comprises metal rings secured at least to said internal panel outer surface and to said external panel.

13. A shelter as claimed in claim 1, wherein said wall and said respective structure members form a movable section of an outer shelter door.

14. The shelter claimed in claim 1, wherein said first energy absorbing means includes helical spring means arranged between said internal panel and said inner flange and secured to said external panel.

15. The shelter claimed in claim 1, wherein said first energy absorbing means includes coil springs extending between and normal to said internal and external panels.

16. The shelter claimed in claim 1, wherein said first energy absorbing means includes sets of Belleville washers strung around pins perpendicular to said internal and external panels.

17. A shelter as claimed in claim 1, and further including second energy absorbing means comprises seal means defined by a plurality of flexible synthetic plastic strips clamped between the external panel outer surface and the inner surfaces of the outer flanges of the associated structure members.

18. A shelter as claimed in claim 10, wherein said outer flanges are flanges of detachable T-section coverplates having other flanges securable to said respective structure members enframing said wall, and having a strut applied against sides of said respective members facing said air space.

19. The shelter claimed in claim 18, wherein said cover plates are fastened to said structure members via tight seals and electrical shielding braids.

20. A shelter as claimed in claim 1, and further including:

(e) door means including a stationary fillister frame and a leaf hingedly connected with said fillister frame, (1) said fillister frame being formed by posts and cross-bars included in said wall structure members, (2) said leaf comprising a back-fillister frame including predetermined members corresponding with said wall structure members, and also an internal panel, an external panel, an air space, and energy absorbing means respectively corresponding with said internal panel, external panel, air space and first energy absorbing means of said one wall and arranged with respect of outer flanges of said predetermined members of said back-fillister frame in a manner analogous to said one wall.

21. A shelter as claimed in claim 20, comprising two flexible tight seals fastened around said leaf, said seals obstructing an interstice between said fillister frame and said back-fillister frame when said door is closed.

22. A shelter as claimed in claim 21, wherein one of said two tight seals has a T-shaped cross-section and two flanges and a leg, said flanges being applied and applicable against edges of outer sides of said back-fillister frame and fillister frame, respectively, said leg being secured to said leaf back-fillister and having a bent lip applicable against said fillister frame.

23. A shelter as claimed in claim 20, comprising electrical contact means fastened partly to said fillister frame.

24. The shelter as claimed in claim 23, wherein said electrical contact means includes a metal stop fastened to said fillister frame, and at least one flexible contact strip fastened to said back-fillister frame, said contact strip coming into contact with said stop when said door is closed.

25. The shelter claimed in claim 24, wherein said stop and said strip are respectively fastened to said frame fillister and said leaf back-fillister through bimetal members.

26. A shelter as claimed in claim 20, wherein said door is an outer door of said shelter, and said shelter further comprises an inner door located behind said outer door, said inner door having a leaf said internal wall panel of said shelter, and having a fixed frame panel with metal sides and having a fixed fillister frame included in said structure.

27. A shelter as claimed in claim 26, comprising electrical contact means fastened partly to said fillister frame of said inner door and partly to a back-fillister frame of said inner door leaf.

28. A shelter as claimed in claim 27, wherein said electrical contact means includes a metal stop fastened to said fillister of said inner door, and at least one flexible contact, a into contact with said stop when said inner door is closed.

29. A shelter as claimed in claim 28, wherein said stop and said strip are respectively fastened to said frame fillister and said leaf back-fillister through bimetal members.

30. A shelter comprising walls and metal structure members enframing said walls, respectively, respective structure members that enframe a wall each having an inner flange and an outer flange arranged parallel with said wall, at least one of said walls comprising:
  (a) an internal panel having inner and outer metal sides, said outer metal side being fastened and electrically connected with an inner side of said inner flanges of said respective members;
  (b) an external shielding panel having peripheral edges of an outer side facing an inner side of said outer flanges of said respective members, said panels being spaced to define an air space extending between said outer side of said internal panel, an inner side of said external panel and lateral sides of said respective members; and
  (c) first energy absorbing means lodged in said air space and in resilient contact with an outer side of said inner flanges of said respective members and with said inner side of said external panel for applying outer side peripheral edges of said external panel against said inner side of said outer flanges, thereby keeping said internal panel floating between said internal panel and said outer flanges.

31. A shelter as claimed in claim 30, wherein said first energy absorbing means includes plural seals in flexible synthetic plastic material clamped in between said internal and external panels.

32. The shelter claimed in claim 31, wherein each of said seals is at least one tubular strip of elastomeric material.

33. A shelter as claimed in claim 30, wherein said first energy absorbing means comprises metal rings secured to at least said inner flanges and to said external panel.

34. The shelter claimed in claim 30, wherein said first energy absorbing means includes helical spring means applied to said inner flanges and secured to said external panel.

35. The shelter claimed in claim 30, wherein said first energy absorbing means includes coil springs applied perpendicularly to and between said internal and external panels.

36. The shelter claimed in claim 30, wherein said first absorbing means includes sets of Belleville washers strung around pins perpendicular to said internal and external panels.

37. A shelter as claimed in claim 30, comprising second energy absorbing means including a seal formed by flexible synthetic material strips that are clamped between said outer side of said external panel and said inner side of said outer flanges of said respective structure members.

38. The shelter as claimed in claim 30, wherein said outer flanges are flanges of detachable T-section cover-plates having other flanges securable to said respective structure members enframing said wall, and having a strut applied against said lateral sides of said respective members.

39. The shelter claimed in claim 30, wherein said cover-plates are fastened to said respective structure members via tight seals and metal shielding braids.

40. A shelter comprising walls, metal structure members enframing said walls, and a door, said door including a fillister frame formed by some of said structure members, and a leaf hinged to said fillister frame, said leaf comprising:
  (a) a back-fillister frame hinged to said fillister frame and formed by metal members substantially analogous to said structure members, each of said back-fillister frame members having an inner flange and an outer flange arranged parallel with the sides of said leaf;
  (b) an internal panel having inner and outer sides, said outer metal side being fastened and electrically connected to an inner side of said inner flanges;
  (c) an external shielding panel having an outer side the peripheral edge portions of which face an inner side of said outer flanges, said panels being spaced to define an air space extending between said outer side of said internal panel, an inner side of said external panel and lateral sides of said back-fillister frame members located between said inner and outer flanges; and
  (d) first energy absorbing means lodged in said air space and in spring contact with an outer side of said inner flanges and with said inner side of said external panel for applying outer side peripheral edges of said external panel against said inner side of said outer flanges, whereby said external panel is in floating relation between said internal panel and said outer flanges.

* * * * *